(12) United States Patent
Kao (10) Patent No.: US 7,342,285 B2
(45) Date of Patent: Mar. 11, 2008

(54) METHOD OF FABRICATING SEMICONDUCTOR DEVICES

(75) Inventor: Ching-Hung Kao, Hsinchu Hsien (TW)

(73) Assignee: United Microeletronics Corp., Hsinchu (TW)

( * ) Notice: Subject to any disclaimer, the term of this patent is extended or adjusted under 35 U.S.C. 154(b) by 0 days.

(21) Appl. No.: 11/458,993

(22) Filed: Jul. 20, 2006

(65) Prior Publication Data

US 2008/0017933 A1    Jan. 24, 2008

(51) Int. Cl.
   *H01L 29/76* (2006.01)
(52) U.S. Cl. ............. 257/379; 257/380; 257/298; 257/300; 257/355; 257/363
(58) Field of Classification Search ........ 257/379, 257/380, 298, 300, 355, 363
   See application file for complete search history.

(56) References Cited

U.S. PATENT DOCUMENTS 5,434,098 A    7/1995   Chang

6,218,234 B1    4/2001   Yu et al.

*Primary Examiner*—Evan Pert
*Assistant Examiner*—Tan Tran
(74) *Attorney, Agent, or Firm*—Jianq Chyun IP Office (57) ABSTRACT

A method of fabricating a semiconductor device is disclosed. First, a substrate is provided. The substrate includes at least a transistor area having a gate structure thereon, a capacitor area having a first electrode thereon and a resistor area having a second electrode thereon. The capacitor area and the resistor area both have an isolation structure therein. Then, first spacers and source/drain regions on both sides of the gate are sequentially formed. After that, a dielectric layer and a first conductive material layer are sequentially formed on the substrate. Next, the first conductive material layer is patterned to form a third electrode in the capacitor area and a conductive layer in the resistor area. Then, second spacers are formed. Afterwards, the exposed dielectric layer is removed. Finally, a self-aligned silicide process is performed to form a metal salicide layer to cover the surface of the device.

16 Claims, 12 Drawing Sheets

METHOD OF FABRICATING SEMICONDUCTOR DEVICES

BACKGROUND OF THE INVENTION

1. Field of the Invention

The present invention relates to a technique for fabricating an integrated circuit device, more particularly, to a semiconductor device and fabricating method thereof.

2. Description of Related Art

In general, a number of devices are used in an integrated circuit to produce the desired circuit functions. These devices may include bipolar and metal-oxide-semiconductor field effect transistors, junction diodes, resistors and capacitors. With the rapid development of electronic products, the demand for integrated circuits (IC) having more desirable properties like higher capacitance, higher operating efficiency and smaller volume increases.

For example, one important requirement of a capacitor is to have a high degree of accuracy even in the absence of an applied voltage. In other words, the capacitor must have a very good charge storage capacity and the loss of electric charges must be kept to a minimum. One commonly used capacitor in integrated circuits is the polysilicon-insulator-polysilicon (PIP) capacitor.

When the PIP capacitors and the transistor devices need to be integrated in an integrated circuit process, an additional masking process is introduced to pattern the polysilicon layer and define the upper electrode of the PIP capacitor. Furthermore, if a silicide process needs to be performed, a block layer is formed over that portion of the areas not requiring any silicide reaction. Therefore, an additional masking process is required to fabricate the block layer so that the covered areas are defined. In particular, because the area already covered by the block layer can prevent a silicide reaction, there is no need for additional film layers. The block layer is also called a self-aligned salicide block (SAB) layer.

Since forming the PIP capacitors increases the fabrication of an integrated circuit device by at least two additional masking processes, for example, the patterning of the polysilicon layer and the self-aligned silicide block layer, the process is more complicated and the cost of production is higher.

In addition, a few U.S. patents have also disclosed some of the techniques related to the foregoing discussion, for example, U.S. Pat. No. 6,218,234 and U.S. Pat. No. 5,434,098. Thus, the articles disclosed in these patents can be used as reference material in the present invention.

SUMMARY OF THE INVENTION

Accordingly, at least one objective of the present invention is to provide a method of fabricating semiconductor devices capable of integrating the fabrication process of PIP capacitors, resistors and transistors and then forming a salicide layer over these devices. Moreover, the fabrication processes are simple and easy to carry out so that the production cost can be reduced.

At least another objective of the present invention is to provide a method of fabricating semiconductor devices capable of integrating the fabrication process of PIP capacitors and transistors and then forming a salicide layer over these devices.

At least another objective of the present invention is to provide semiconductor devices having a self-aligned salicide layer on the surface of transistors, capacitors and resistors.

At least another objective of the present invention is to provide semiconductor devices having a self-aligned salicide layer on the surface of transistors and capacitors.

To achieve these and other advantages and in accordance with the purpose of the invention, as embodied and broadly described herein, the invention provides a method of fabricating semiconductor devices. The method includes the following steps. First, a substrate is provided. The substrate has at least a transistor area, a capacitor area and a resistor area, and both the capacitor area and the resistor area have an isolation structure therein. Then, a gate structure is formed in the transistor area on the substrate, a first electrode is formed in the capacitor area and a second electrode is formed in the resistor area. Next, first spacers are formed on the sidewalls of the gate structure, the first electrode and the second electrode. After that, a source/drain region is formed in the substrate on each side of the gate structure. Next, a dielectric layer and a first conductive material layer are sequentially formed on the substrate. A first patterning process is performed to define the first conductive material layer so that a third electrode is formed on the dielectric layer in the capacitor area and a conductive layer is formed on the dielectric layer in the resistor area simultaneously. Then, second spacers are formed on the sidewalls of the third electrode and the conductive layer. The dielectric layer uncovered by the third electrode, the conductive layer and the second spacers is removed. After that, a self-aligned silicide process is performed to form a salicide layer on the surface of the gate structure, the source/drain region, the first electrode, the third electrode, the conductive layer and the second electrode.

According to the method of fabricating semiconductor devices in the embodiment of the present invention, the first patterning process includes performing a photolithographic process and an etching process.

According to the method of fabricating semiconductor devices in the embodiment of the present invention, the method of forming the gate structure, the first electrode and the second electrode includes, for example, the following steps. First, a dielectric material layer is formed on the substrate in the transistor area. Then, a second conductive material layer is formed on the substrate to cover the dielectric material layer and the isolation structure. A second patterning process is performed to define the second conductive material layer so that a gate is formed on the substrate in the transistor area, a first electrode is formed in the capacitor area and a second electrode is formed in the resistor area simultaneously. Afterwards, the dielectric material layer uncovered by the gate is removed to form a gate dielectric layer, wherein the gate dielectric layer and the gate together serve as a gate structure. The foregoing second conductive material layer is fabricated using, for example, polysilicon or doped polysilicon. The second patterning process includes, for example, performing a photolithographic process and an etching process.

According to the method of fabricating semiconductor devices in the embodiment of the present invention, the first conductive material layer is fabricated using, for example, polysilicon or doped polysilicon.

According to the method of fabricating semiconductor devices in the embodiment of the present invention, the dielectric layer is fabricated using, for example, silicon oxide or silicon nitride.

According to the method of fabricating semiconductor devices in the embodiment of the present invention, the salicide layer is fabricated using a refractory metal salicide compound. The refractory metal is selected from a group consisting of nickel, tungsten, cobalt, titanium, molybdenum and platinum, for example.

The present invention provides another method of fabricating semiconductor devices. The method includes the following steps. First, a substrate is provided. The substrate has at least a transistor area and a capacitor area, and the capacitor area has an isolation structure therein. Then, a first dielectric layer is formed on the substrate in the transistor area. After that, a first conductive layer, a second dielectric layer and a second conductive layer are sequentially formed on the substrate to cover the isolation structure and the first dielectric layer. Next, a first patterning process is performed to define the second conductive layer and the second dielectric layer and form the first electrode and the capacitor dielectric layer of a capacitor in the capacitor area. Thereafter, the first dielectric layer uncovered by the gate is removed to form a gate dielectric layer. A lightly doped drain (LDD) is formed in the substrate on each side of the gate. Then, first spacers are formed on the sidewalls of the gate, the gate dielectric layer, the first electrode, the capacitor dielectric layer and the second electrode. A doped region is formed in the substrate on each side of the first spacers in the transistor area. The LDD and the doped region together serve as a source/drain region. After that, a self-aligned silicide process is performed to form a salicide layer on the surface of the gate, the source/drain region, the first electrode and the second electrode.

According to the method of fabricating semiconductor devices in the embodiment of the present invention, the first patterning process includes performing a photolithographic process and an etching process.

According to the method of fabricating semiconductor devices in the embodiment of the present invention, the second patterning process includes performing a photolithographic process and an etching process.

According to the method of fabricating semiconductor devices in the embodiment of the present invention, the first conductive material layer and the second conductive material layer are fabricated using, for example, polysilicon or doped polysilicon.

According to the method of fabricating semiconductor devices in the embodiment of the present invention, the second dielectric layer is fabricated using, for example, silicon oxide or silicon nitride.

According to the method of fabricating semiconductor devices in the embodiment of the present invention, the salicide layer is fabricated using a refractory metal salicide compound. The refractory metal is selected from a group consisting of nickel, tungsten, cobalt, titanium, molybdenum and platinum, for example.

The present invention also provides a semiconductor device. The semiconductor device includes a substrate, a transistor, a capacitor and a resistor. The substrate has a transistor area, a capacitor area and a resistor area. Both the capacitor area and the resistor area have an isolation structure therein. The transistor is disposed on the substrate in the transistor area. The transistor includes a gate structure on the substrate, a source/drain region in the substrate on each side of the gate structure, spacers on the sidewalls of the gate structure and a first salicide layer on the surface of the gate structure and the source/drain regions. The gate structure further includes a gate dielectric layer and a gate. The capacitor is disposed on the isolation structure in the capacitor area. The capacitor further includes a first electrode, a capacitor dielectric layer, a second electrode and a second salicide layer. The first electrode is disposed on the isolation structure within the capacitor area. The capacitor dielectric layer is disposed on the first electrode and covers a portion of the surface of the first electrode. The second electrode is disposed on the capacitor dielectric layer. The second salicide layer is disposed on the exposed first electrode and on the second electrode. Furthermore, the resistor is disposed on the isolation structure in the resistor area. The resistor includes a third electrode and a third salicide layer. The third electrode is disposed on the isolation structure within the resistor area. The third salicide layer is disposed on the third electrode and covers the edge of the third electrode.

According to the semiconductor device in the embodiment of the present invention, the gate, the first electrode and the third electrode are fabricated using the same material, for example, polysilicon or doped polysilicon.

According to the semiconductor device in the embodiment of the present invention, the second electrode and the conductive layer are fabricated using, for example, polysilicon or doped polysilicon.

According to the semiconductor device in the embodiment of the present invention, the capacitor dielectric layer and the dielectric layer are fabricated using, for example, silicon oxide or silicon nitride.

According to the semiconductor device in the embodiment of the present invention, the first, second and third salicide layers are fabricated using a refractory metal salicide compound. The refractory metal is selected from a group consisting of nickel, tungsten, cobalt, titanium, molybdenum and platinum, for example.

The present invention also provides another semiconductor device. The semiconductor device includes a substrate, a transistor and a capacitor. The substrate has a transistor area and a capacitor area and the capacitor area has an isolation structure therein. The transistor is disposed on the substrate in the transistor area. The transistor includes a gate structure on the substrate, a source/drain region in the substrate on each side of the gate structure, spacers on the sidewalls of the gate structure and a first salicide layer on the surface of the gate structure and the source/drain regions. The gate structure further includes a gate dielectric layer and a gate. The capacitor is disposed on the isolation structure in the capacitor area. The capacitor further includes a first electrode, a capacitor dielectric layer, a second electrode and a second salicide layer. The first electrode is disposed on the isolation structure within the capacitor area. The capacitor dielectric layer is disposed on the first electrode and covers a portion of the surface of the first electrode. The second electrode is disposed on the capacitor dielectric layer. The second salicide layer is disposed on the exposed first electrode and on the second electrode.

According to the semiconductor device in the embodiment of the present invention, the gate and the first electrode are fabricated using the same material, for example, polysilicon or doped polysilicon.

According to the semiconductor device in the embodiment of the present invention, the second electrode is fabricated using, for example, polysilicon or doped polysilicon.

According to the semiconductor device in the embodiment of the present invention, the capacitor dielectric layer is fabricated using, for example, silicon oxide or silicon nitride.

According to the semiconductor device in the embodiment of the present invention, the first and second salicide layers are fabricated using a refractory metal salicide compound. The refractory metal is selected from a group consisting of nickel, tungsten, cobalt, titanium, molybdenum and platinum, for example.

In the present invention, a masking process is used to define the upper electrode of a PIP capacitor and the self-aligned silicide block layer simultaneously so that that portion of the surface not requiring any silicide deposition is prevented from having a silicide reaction. Therefore, the method in the present invention can simplify the fabrication process and save production cost. Moreover, a metal salicide layer can also be formed on the surface of a capacitor and a resistor to increase the accuracy of the capacitor and improve the performance of the devices.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1G are schematic cross-sectional views showing the steps for fabricating semiconductor devices according to one embodiment of the present invention.

Figure 1A:
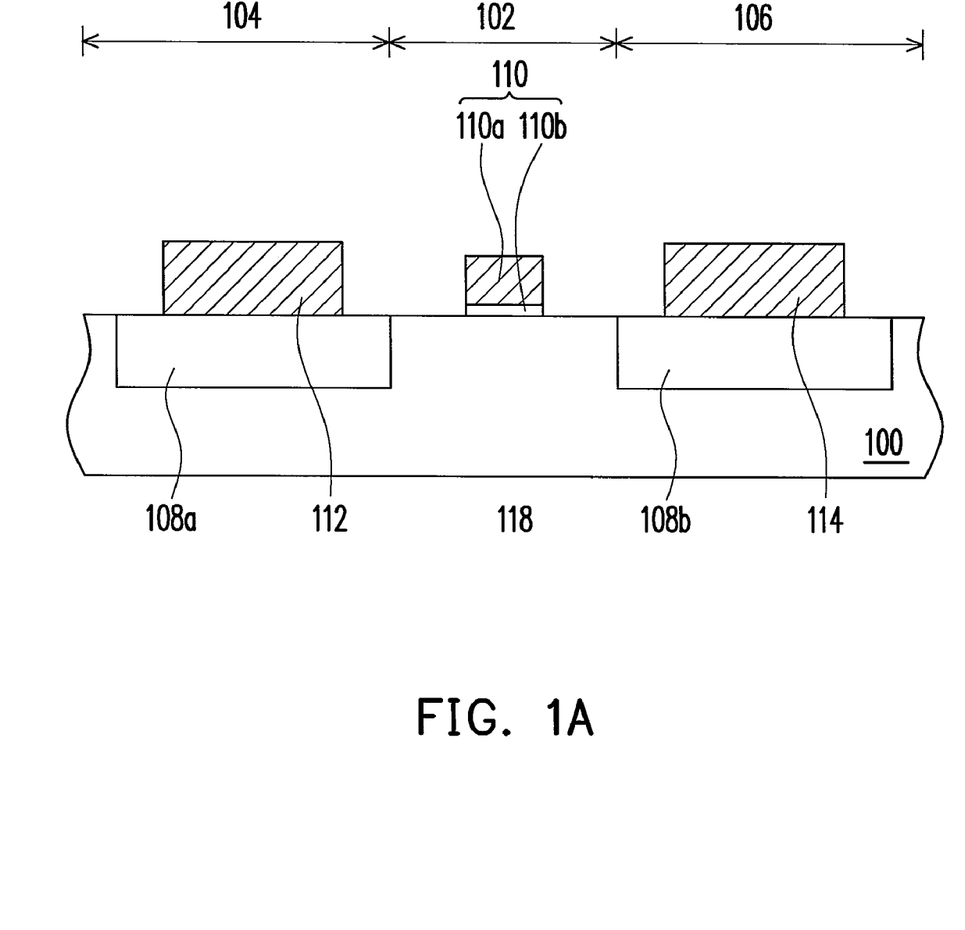
FIGS. 1A through 1G are schematic cross-sectional views showing the steps for fabricating semiconductor devices according to one embodiment of the present invention.

First, as shown in FIG. 1A, a substrate 100 is provided. The substrate 100 can be, for example, a silicon bulk substrate or a silicon-on-insulator (SOI) substrate. The substrate 100 has at least a transistor area 102, a capacitor area 104 and a resistor area 106. The substrate 100 in the capacitor area 104 has an isolation structure 108a therein and the substrate 100 in the resistor area 106 has another isolation structure 108b therein. The isolation structures 108a and 108b are, for example, shallow trench isolation (STI) structures or field isolation structures formed by the local oxidation of silicon (LOCOS) technique.

As shown in FIG. 1A, a gate structure 110 is formed on the substrate 100 within the transistor area 102, an electrode 112 is formed on the isolation structure 108a within the capacitor area 104 and another electrode 114 is formed on the isolation structure 108b within the resistor area 106. The electrode 114 can serve as a resistor device.

The method of forming the foregoing gate structure 110, the electrode 112 and the electrode 114 includes, for example, the following steps. First, a dielectric material layer (not shown) is formed on the substrate 100 within the transistor area 102. The material constituting the dielectric material layer includes, for example, silicon oxide and the forming method of the dielectric material layer includes, for example, performing a chemical vapor deposition process. Then, a conductive material layer (not shown) is formed to cover the entire substrate. The material constituting the conductive material layer includes, for example, polysilicon or doped polysilicon. Next, a patterning process is performed to define the conductive material layer so that a gate 110a is formed on the substrate 100 in the transistor area 102, an electrode 112 is formed on the isolation structure 108a in the capacitor area 104 and another electrode 114 is formed on the isolation structure 108b in the resistor area 106 simultaneously. The foregoing patterning process includes performing a photolithographic process and an etching process, for example. After that, the dielectric material layer uncovered by the gate 110a is removed to form a gate dielectric layer 110b. The gate 110a and the gate dielectric layer 110b together form the gate structure 110.

Figure 1B:
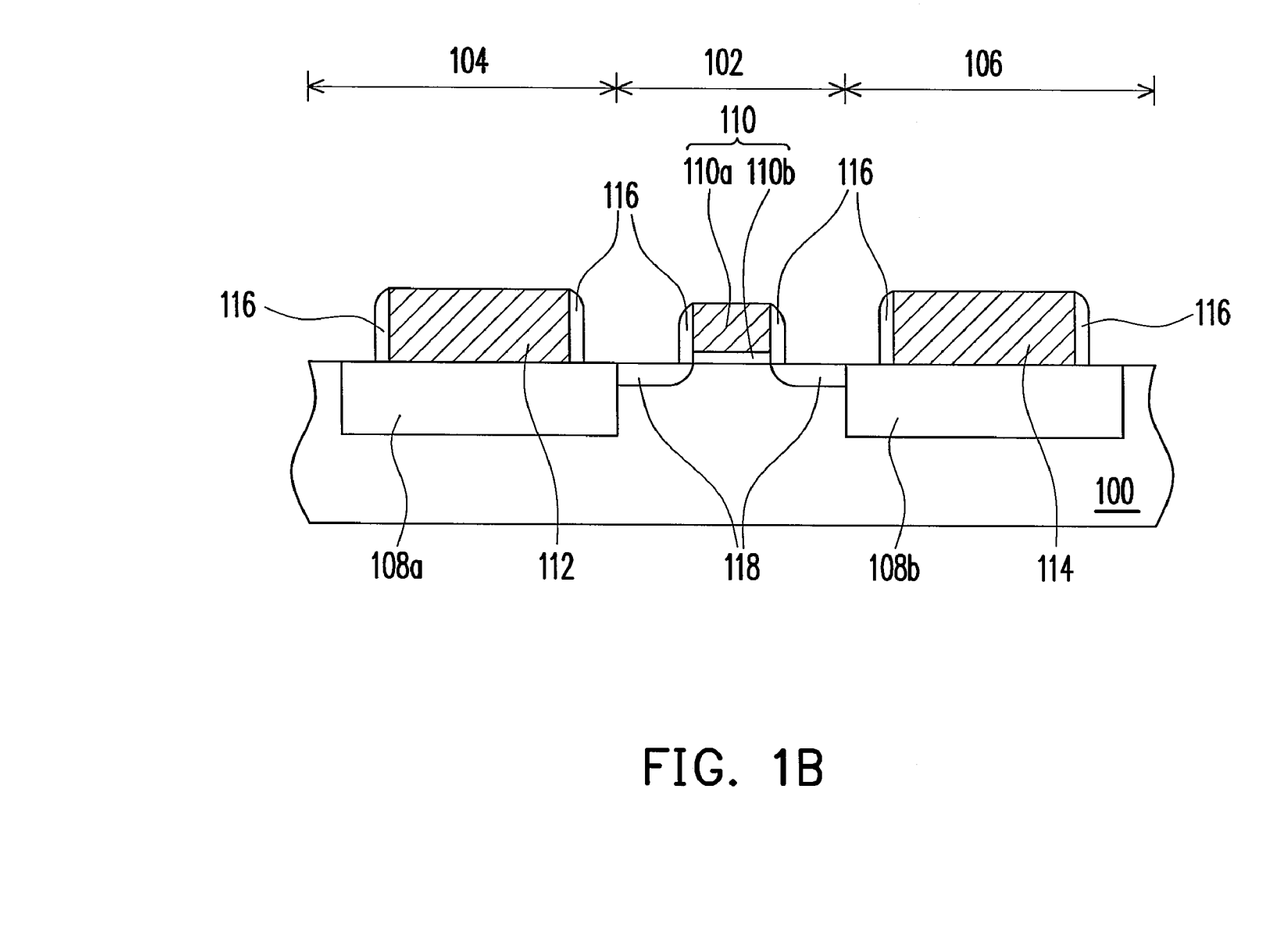

As shown in FIG. 1B, spacers 116 are formed on the sidewalls of the gate structure 110, the electrode 112 and the electrode 114. The method of forming the spacers 116 includes, for example, performing a chemical vapor deposition (CVD) process to form a silicon nitride layer and then performing a dry etching process to remove excess silicon nitride. Then, a source/drain region 118 is formed in the substrate 100 on the sides of the gate structure 110. The method of forming the source/drain region 118 includes, for example, performing an ion implantation. The foregoing gate structure 110, the spacers 116 and the source/drain regions 118 together constitute a transistor device in the transistor area 102.

Figure 1C:
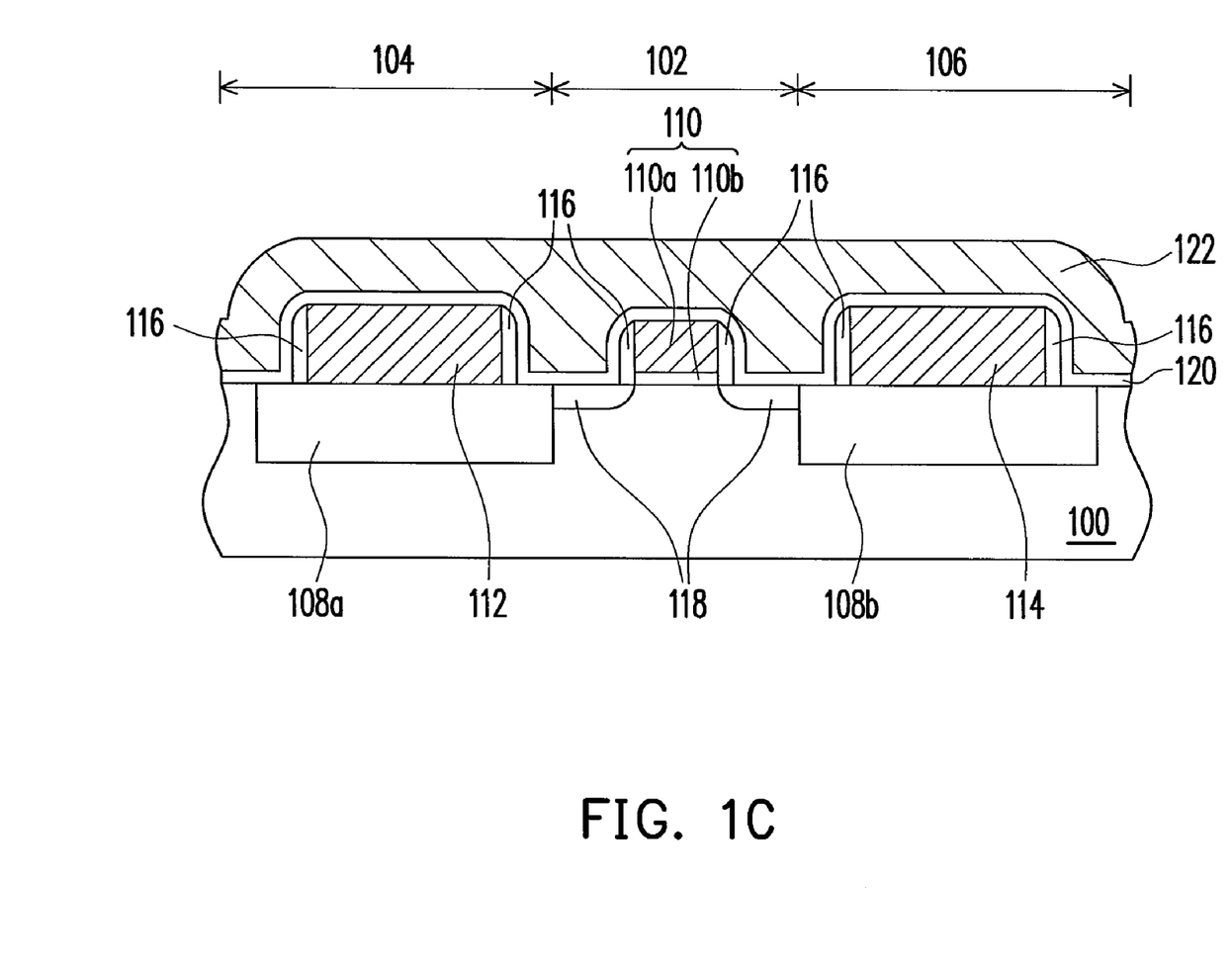

As shown in FIG. 1C, a dielectric layer 120 is formed conformably over the substrate 100 to cover the entire substrate 100. The material constituting the dielectric layer 120 includes silicon oxide, silicon nitride or other suitable dielectric material, for example. The method of forming the dielectric layer 120 includes, for example, performing a chemical vapor deposition process. After that, a conductive material layer 122 is formed on the dielectric layer 120. The material constituting the conductive material layer 122 includes polysilicon or doped polysilicon, for example.

Figure 1D:
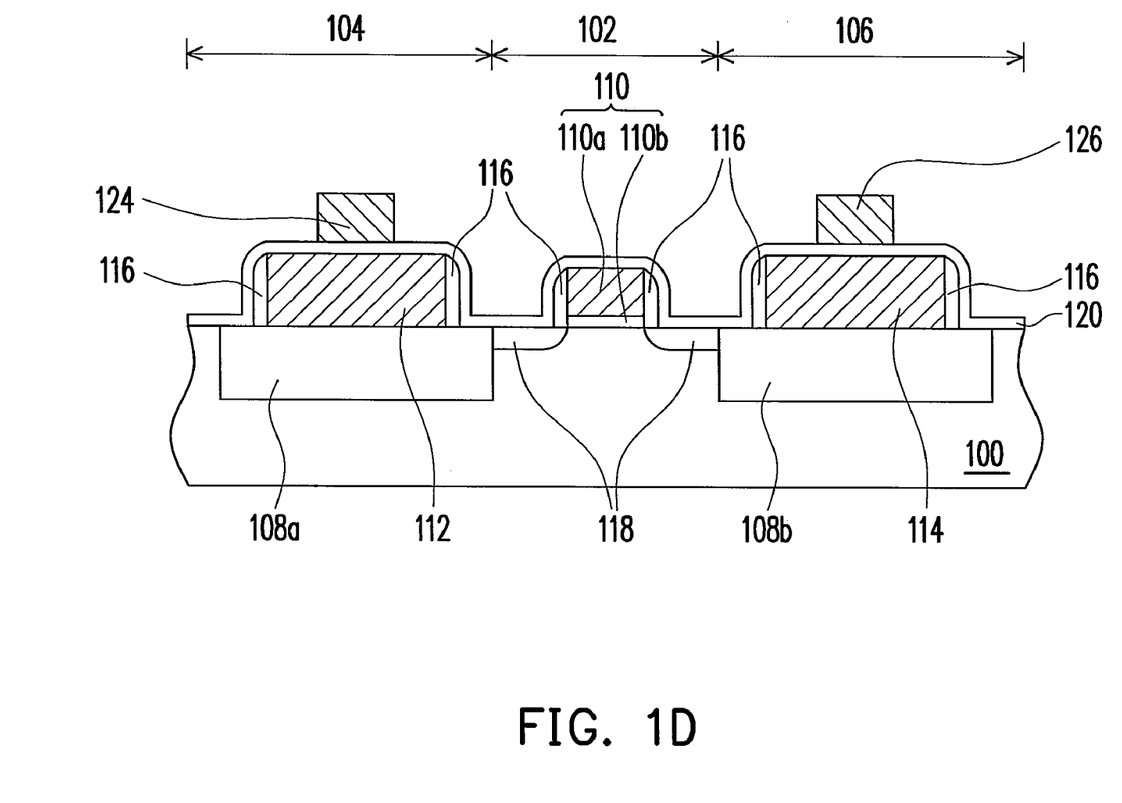

As shown in FIG. 1D, a patterning process is performed to define the conductive material layer 122 to form an electrode 124 on the dielectric layer 120 in the capacitor area 104 and a conductive layer 126 on the dielectric layer 120 in the resistor area 106 simultaneously. The foregoing patterning process for defining the conductive layer 122 includes, for example, a photolithographic process and an etching process.

It should be noted that a patterning process is used in the present embodiment to define the electrode 124 within the capacitor area 104 and the conductive layer 126 within the resistor area 106. The dielectric layer 120 between the electrodes 112 and 124 in the capacitor area 104 serves as a capacitor dielectric layer. Furthermore, the dielectric layer 120 with a conductive layer 126 thereon can serve as a self-aligned salicide block (SAB) layer to prevent a silicide reaction in areas requiring no salicide compound. In other words, only one masking process is required in the present embodiment to define the electrode of the PIP capacitor and the SAB layer simultaneously. Consequently, the fabrication process is simplified and the production cost is reduced.

Figure 1E:
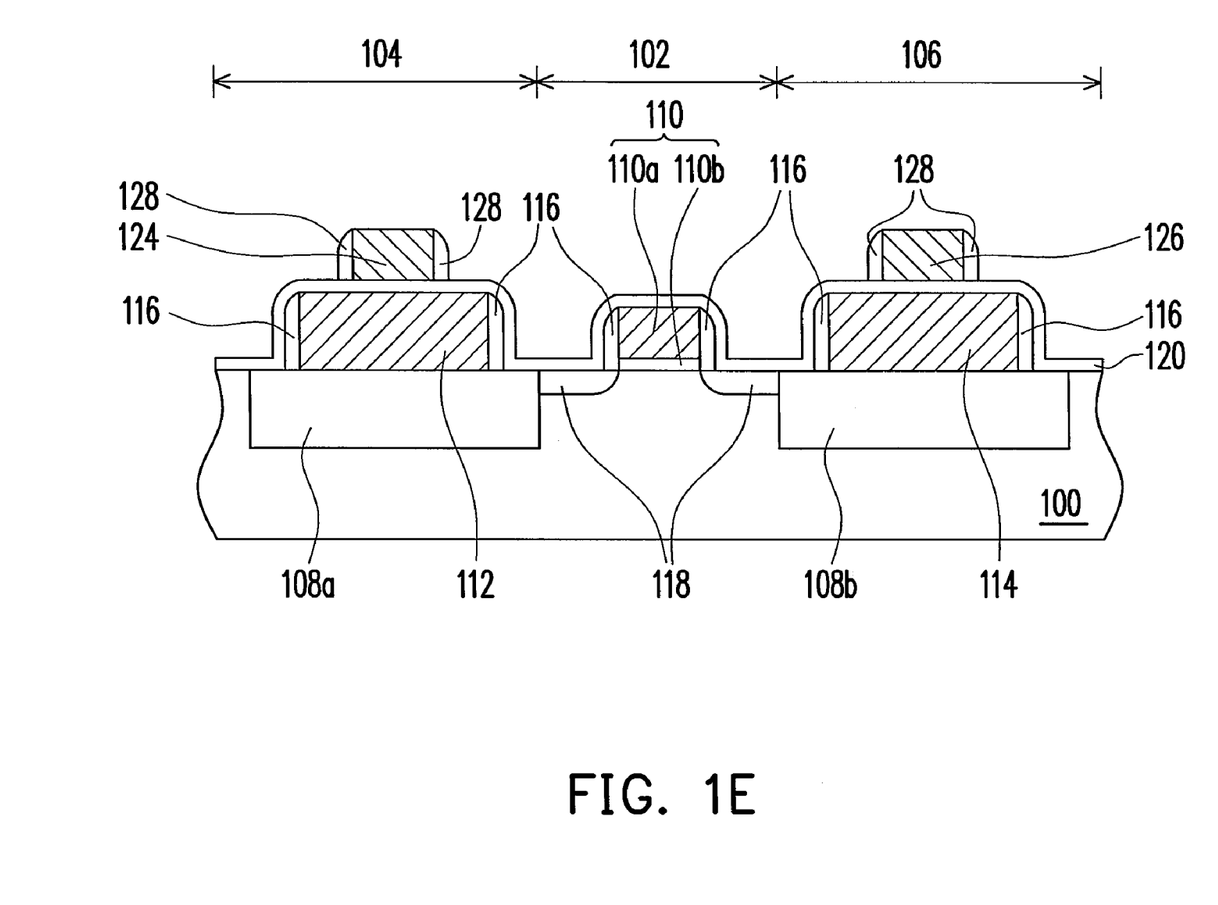

As shown in FIG. 1E, spacers 128 are formed on the sidewalls of the electrode 124 and the sidewalls of the conductive layer 126. The method of forming the spacers 128 includes depositing a silicon nitride layer in a chemical vapor deposition and performing a dry etching process to remove excess silicon nitride, for example. The spacers 128 serve to prevent an abnormal electrical connection between the electrode 112 and the electrode 124 in the capacitor area 104 and an abnormal electrical connection between the electrode 114 and the conductive layer 126 in the resistor area 106.

Figure 1F:
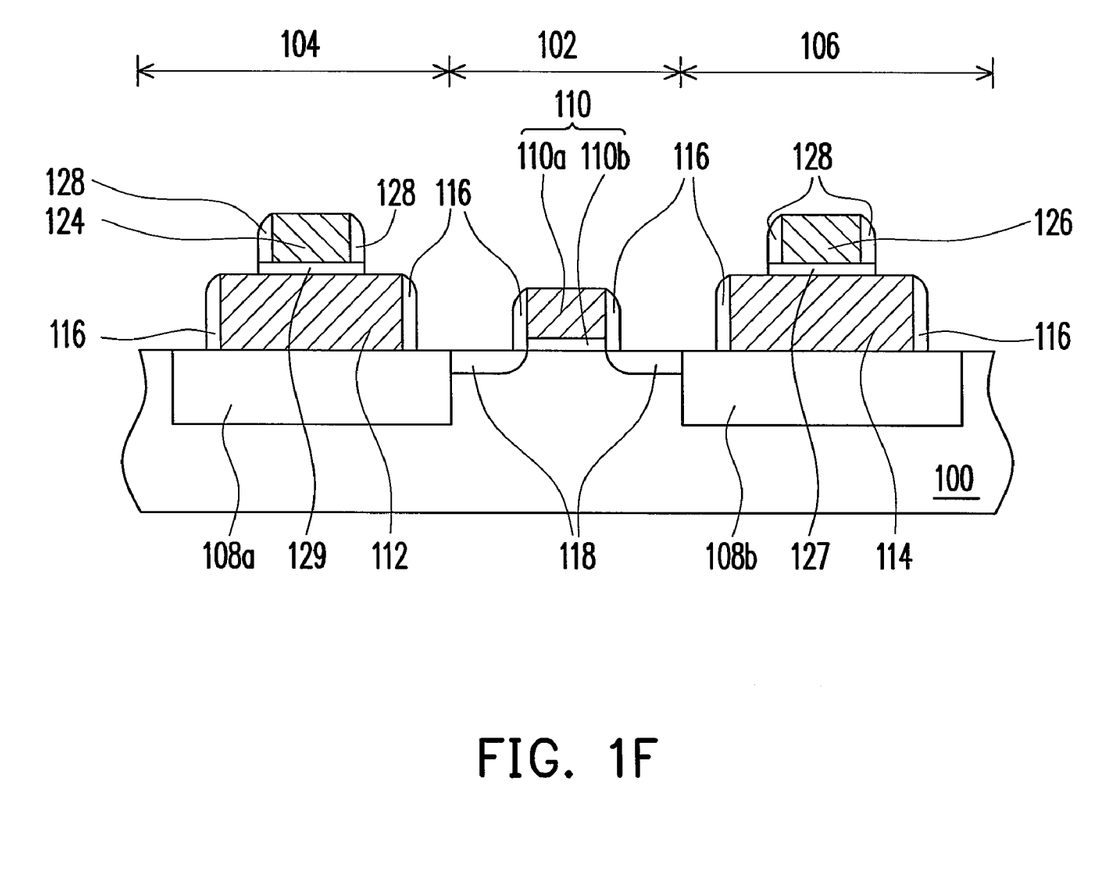

As shown in FIG. 1F, the dielectric layer 120 uncovered by the electrode 124, the conductive layer 126 and the spacers 128 is removed to form dielectric layers 127 and 129. The method of removing a portion of the dielectric layer 120 includes, for example, performing a wet etching process. The dielectric layer 129 in the capacitor area 104 serves as a capacitor dielectric layer so that the electrode 112, the dielectric layer 129 and the electrode 124 together form a polysilicon-insulator-polysilicon (PIP) capacitor device in the capacitor area 104.

Figure 1G:
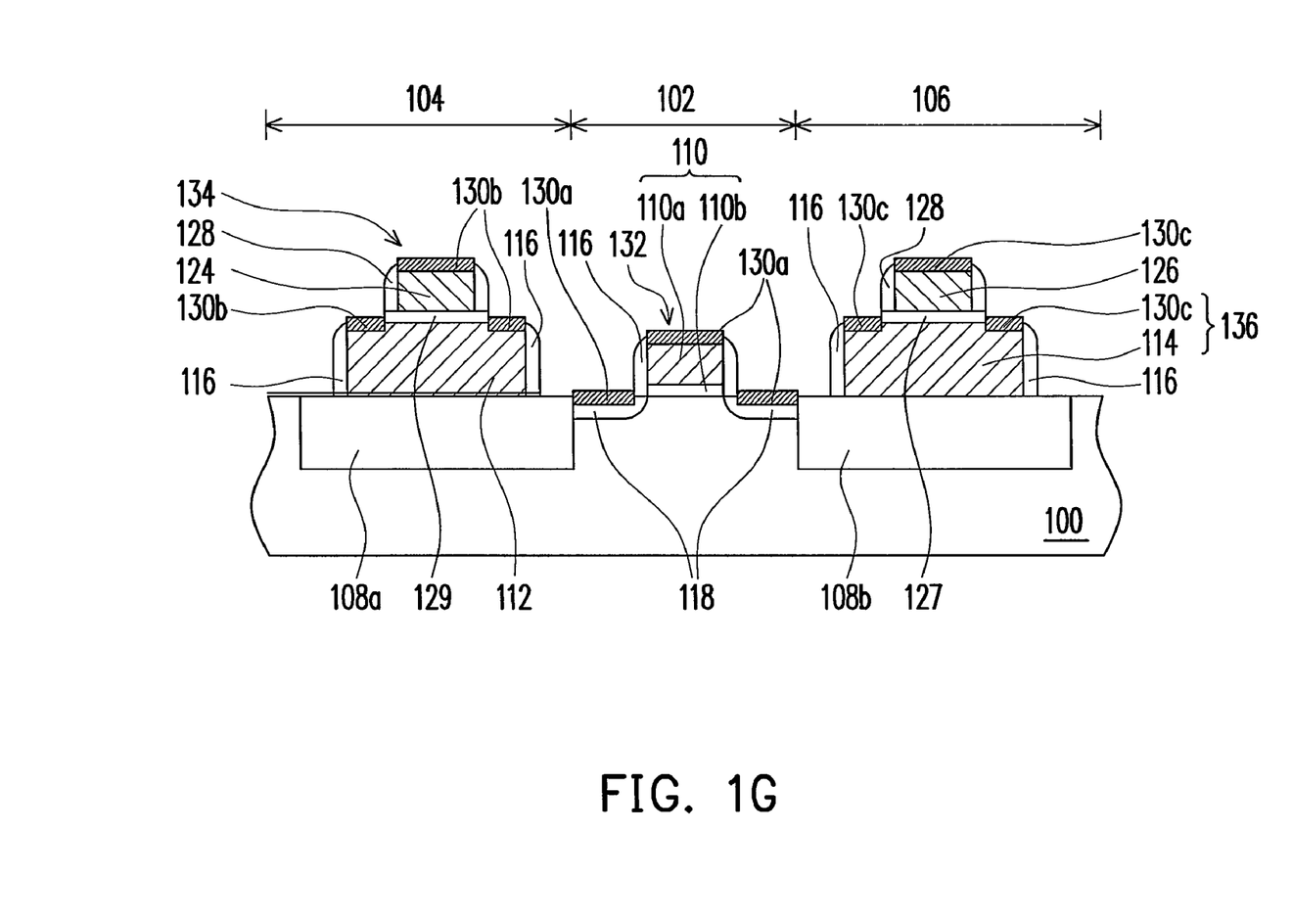

As shown in FIG. 1G, a self-aligned silicide process is performed to form a salicide layer. The salicide layer includes a salicide layer 130b formed on the surface of the electrodes 112 and 114, a salicide layer 130a formed on the surface of the gate structure 110 and the source/drain regions 118 and a salicide layer 130c formed on the surface of the conductive layer 126 and the electrode 114.

The foregoing gate structure 110, spacers 116, the source/drain regions 118 and the salicide layer 130a together constitute a transistor 132 within the transistor area 102 in the present embodiment. The foregoing electrode 112, the dielectric layer 128, the electrode 124 and the salicide layer 130b together constitute a capacitor 134 within the capacitor area 104 in the present embodiment. Furthermore, the conductive layer 114 and the salicide layer 130c on the surface of the conductive layer 114 together constitute a resistor 136 within the resistor area 106 in the present embodiment.

The foregoing silicon layers 130a, 130b, 130c are fabricated using refractory metal salicide compound, for example. The refractory metal is selected from a group consisting of nickel, tungsten, cobalt, titanium, molybdenum and platinum. The self-aligned silicide process includes the following steps, for example. First, a metallic layer (not shown) is deposited over the entire substrate 100 in a DC sputtering process. Then, a thermal process is performed so that the metallic layer reacts with silicon to form a salicide layer. After that, a wet etching process is performed to remove the remaining metallic layer not participating in the reaction. Next, another thermal process at a higher temperature is performed to reduce the impedance of the salicide layer. In the present embodiment, one masking process is used to define the upper electrode of a PIP capacitor and the self-aligned salicide block layer simultaneously. Therefore, the fabrication process is simplified and the production cost is reduced. Moreover, in addition to forming a salicide layer on the transistor device, a salicide layer is also formed on the surface of the PIP capacitor device and the resistor device at the same time. Hence, not only is the impedance of the metallic lines reduced, but the accuracy and performance of the capacitor and the resistor are also enhanced.

In the present embodiment, a masking process is used to define the upper electrode of a PIP capacitor and the self-aligned silicide block layer simultaneously. Therefore, the method in the present embodiment can simplify the fabrication process and save production cost. Moreover, a metal salicide layer can also be formed on the surface of a capacitor and a resistor to reduce the impedance of the metallic lines and increase the accuracy of the devices and improve the performance of the devices.

In the following, a semiconductor device according to one embodiment of the present invention is explained using FIG. 1G.

Again, as shown in FIG. 1G, the semiconductor device includes a substrate 100, a transistor 132, a capacitor 134 and a resistor 136.

The substrate 100 has a transistor area 102, a capacitor area 104 and a resistor area 106. Furthermore, both the capacitor area 104 and the resistor area 106 have an isolation structure 108a and 108b respectively.

The transistor 132 is disposed on the substrate 100 in the transistor area 104. The transistor 132 comprises a gate structure 110 on the substrate 100, a source/drain region 118 in the substrate 100 on each side of the gate structure 110, spacers 116 on the sidewalls of the gate structure 110 and a salicide layer 130a. The gate structure 110 further includes a gate dielectric layer 110b and a gate 110a. The material constituting the gate dielectric layer 110b includes silicon oxide and the material constituting the gate 110a includes polysilicon or doped polysilicon, for example. In addition, the salicide layer 130a is disposed on the surface of the gate structure 110 and the source/drain regions 108. The material constituting the salicide layer 130a includes a refractory metal salicide compound, for example. The refractory metal is selected from a group consisting of nickel, tungsten, cobalt, titanium, molybdenum and platinum.

The capacitor 134 is disposed on the isolation structure 108a within the capacitor area 104. The capacitor 134 comprises a first electrode 112, a dielectric layer 129, a second electrode 124 and a salicide layer 130b. The electrode 112 is disposed on the isolation structure 108a within the capacitor area 104. The material constituting the electrode 112 includes, for example, polysilicon or doped polysilicon. The dielectric layer 129 is disposed on the electrode 112 and covers a portion of the surface of the electrode 112. The dielectric layer 129 serves as a capacitor dielectric layer and the material constituting the dielectric layer 129 includes silicon oxide layer, for example. The electrode 124 is disposed on the dielectric layer 129. The material constituting the electrode 124 includes, for example, polysilicon or doped polysilicon. The salicide layer 130b is disposed on the exposed electrode 112 and the exposed electrode 124. The material constituting the salicide layer 130b includes, for example, a refractory metal salicide compound. The refractory metal is selected from a group consisting of nickel, tungsten, cobalt, titanium, molybdenum and platinum.

The resistor 136 is disposed on the isolation structure 108b within the resistor area 106. The resistor 136 includes an electrode 114 and a salicide layer 130c. The electrode 114 is disposed on the isolation structure 108b and is fabricated using, for example, polysilicon or doped polysilicon. The salicide layer 130c is disposed on the exposed electrode 114. The material constituting the salicide layer 130c includes, for example, a refractory metal salicide compound. The refractory metal is selected from a group consisting of nickel, tungsten, cobalt, titanium, molybdenum and platinum.

The semiconductor devices in the present embodiment include transistors, capacitors and resistors. Furthermore, the surfaces of these devices have a salicide layer disposed thereon for reducing the impedance between the devices and the metallic lines and enhancing the accuracy and overall device performance of the capacitors and the resistors.

FIGS. 2A through 2E are schematic cross-sectional views showing the steps for fabricating semiconductor devices according to another embodiment of the present invention.

Figure 2A:
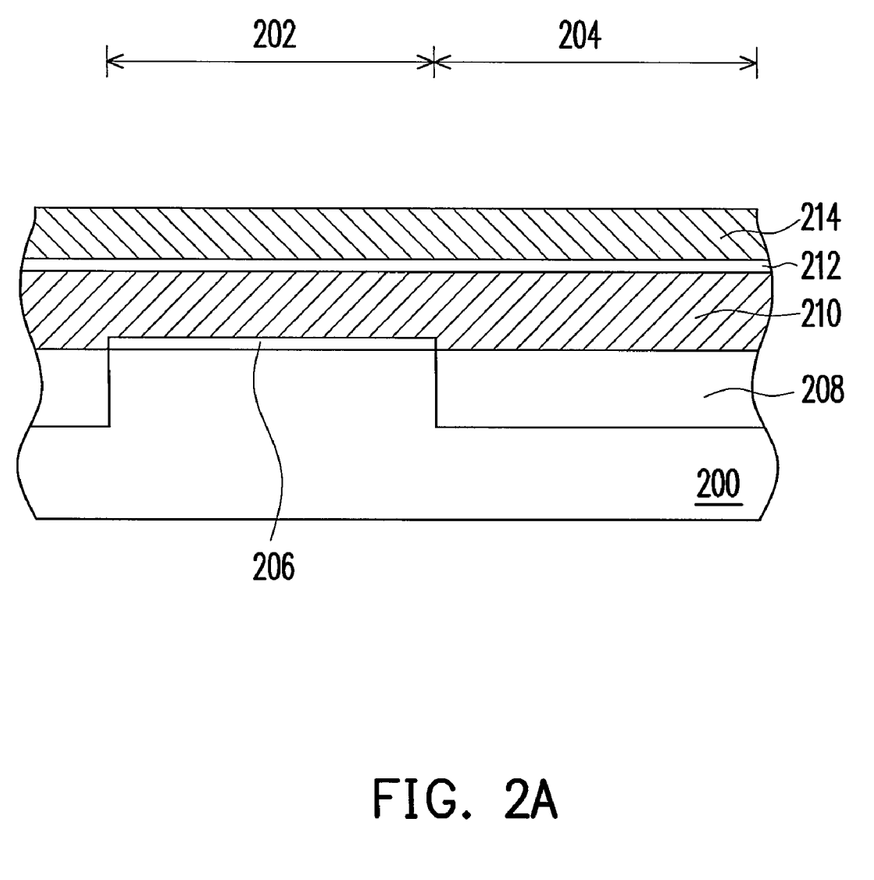
FIGS. 2A through 2E are schematic cross-sectional views showing the steps for fabricating semiconductor devices according to another embodiment of the present invention.

First, as shown in FIG. 2A, a substrate 200 is provided. The substrate 200 has a transistor area 202 and a capacitor area 204. The capacitor area 204 has an isolation structure 208 disposed therein. The substrate 200 in the transistor area 202 has a dielectric layer 206 formed thereon. The material constituting the dielectric layer 206 includes, for example, silicon oxide. The method of forming the dielectric layer 206 includes, for example, performing a thermal oxidation process.

Then, a first conductive layer 210, a dielectric layer 212 and a second conductive layer 214 are sequentially formed on the substrate 200 to cover the isolation structure 208 and the dielectric layer 206. The first conductive layer 210 and the second conductive layer 214 are fabricated using an identical material, for example, polysilicon or doped polysilicon. The dielectric layer is fabricated using, for example, silicon oxide or silicon nitride.

Figure 2B:
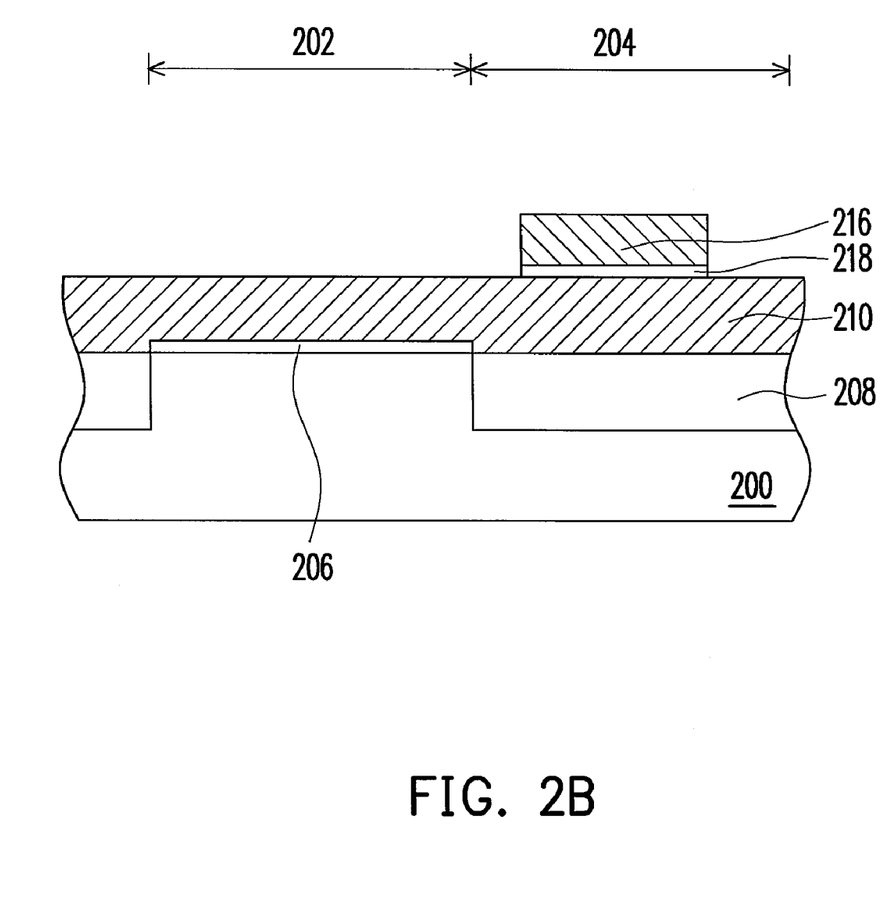

As shown in FIG. 2B, a patterning process is performed to define the conductive layer 214 and the dielectric layer 212 so that a conductive layer serving as an electrode 216 of a capacitor and a dielectric layer 218 serving as a capacitor dielectric layer of the capacitor are formed in the capacitor area 204. The foregoing patterning process includes, for example, performing a photolithographic process and an etching process.

Figure 2C:
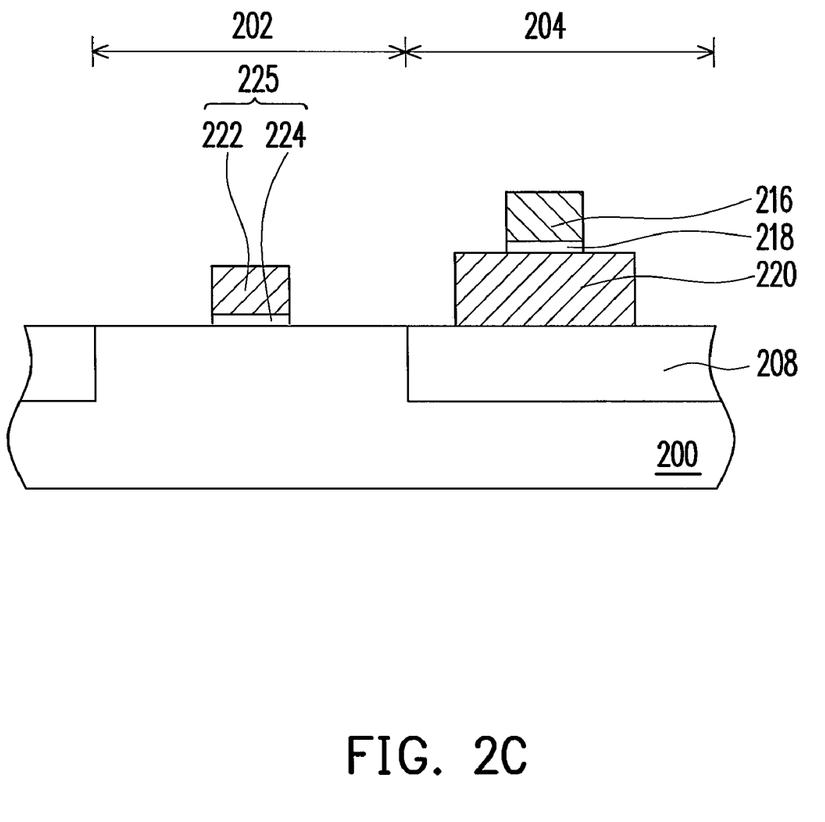

As shown in FIG. 2C, another patterning process is performed to define the conductive layer 210 so that an electrode 220 of the capacitor is formed in the capacitor area 204 and a gate 222 is formed in the transistor area 202.

Then, the dielectric layer 206 uncovered by the gate 222 is removed to form a gate dielectric layer 224. The method of removing the dielectric layer 206 uncovered by the gate 222 includes performing a wet etching process using, for example, hydrofluoric acid as the etchant. The foregoing gate 222 and the gate dielectric layer 224 together constitute a gate structure 225.

Figure 2D:
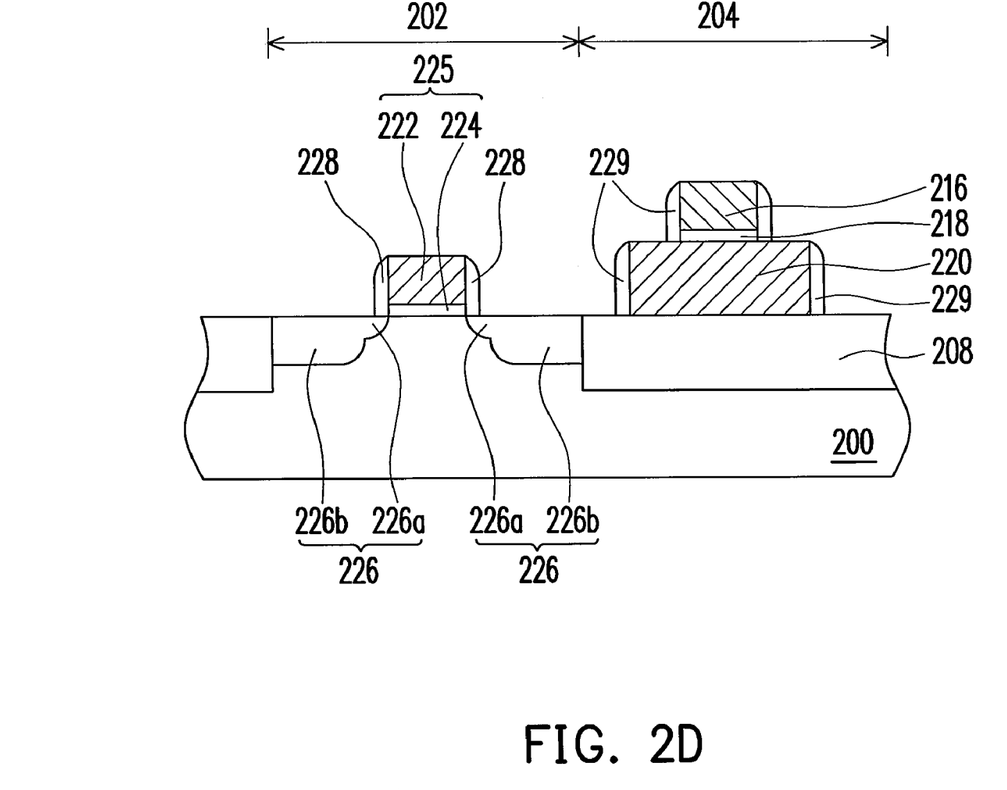

As show in FIG. 2D, a lightly doped drain (LDD) 226a is formed in the substrate 200 on the sides of the gate 222. Then, spacers 228 are formed on the sidewalls of the gate 222 and the gate dielectric layer 224. Furthermore, spacers 229 are formed on the sidewalls of the electrode 216, the dielectric layer 218 and the electrode 220. The spacers 228 and 229 can be formed simultaneously, for example. The method of forming the spacers 228, 229 includes, for example, forming a spacer material layer (not shown) over the entire substrate 200 and then performing an anisotropic etching process to remove a portion of the spacer material layer.

After that, as shown in FIG. 2D, a doped region 226b is formed in the substrate 200 on each side of the spacers 228 so that the LDD 226a and the doped region 226b together form a source/drain region 226.

Figure 2E:
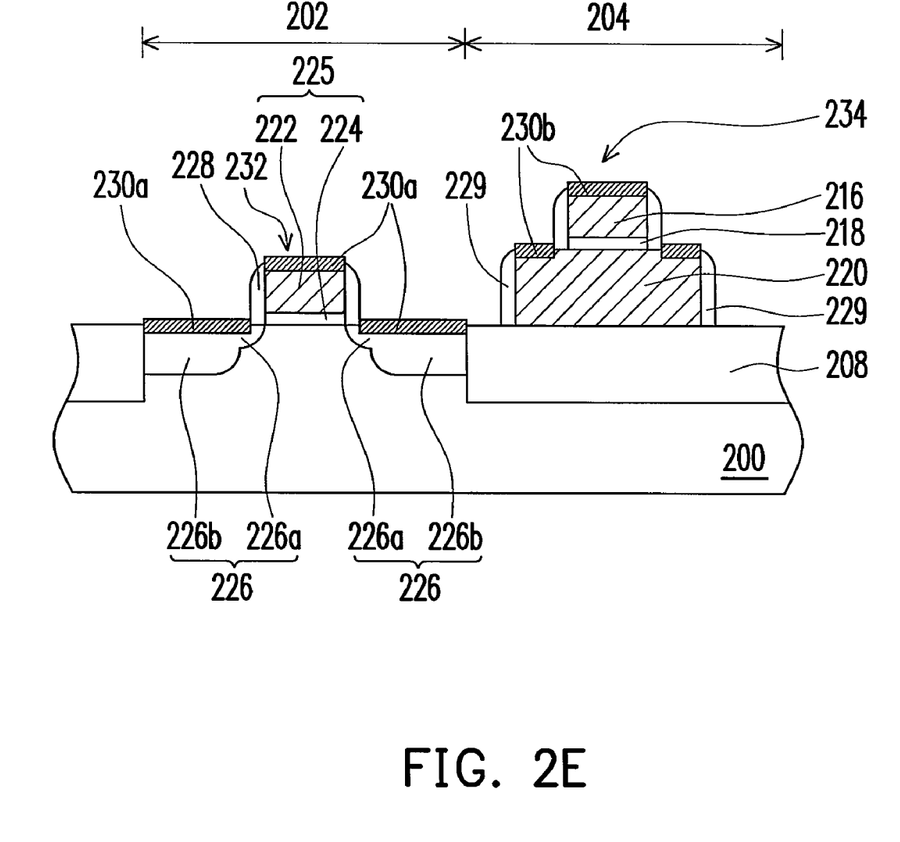

As shown in FIG. 2E, a self-aligned silicide process is performed to form a salicide layer to cover the surface of the gate 222, the source/drain regions 226, the electrode 216 and the electrode 220. The salicide layer includes a salicide layer 230a formed on the surface of the gate 222 and the source/drain regions 226 and a salicide layer 230b formed on the surface of the electrode 216 and the electrode 220. The material constituting the salicide layers 230a and 230b includes, for example, a refractory metal salicide compound. The refractory metal is selected from a group consisting of nickel, tungsten, cobalt, titanium, molybdenum and platinum. The foregoing gate 222, the gate dielectric layer 224, the source/drain regions 226, the spacers 228 and the spacers 229, and the salicide layer 230a together constitute a transistor 232. The foregoing electrode 216, the dielectric layer 218, the electrode 220 and the salicide layer 230b together constitute a polysilicon-insulator-polysilicon (PIP) capacitor 234.

The method of fabricating semiconductor devices in the present invention integrates the process of forming the PIP capacitors and the transistors so that a salicide layer is formed on the PIP capacitors and the transistors simultaneously. Thus, the accuracy of the capacitor is enhanced and the device performance is improved. Moreover, the method in the present embodiment does not need to perform an additional masking process to produce a salicide layer on the transistors and capacitors. Therefore, the method of the present invention will not increase the complexity of fabrication and the cost of production.

In the following, a semiconductor device according to one embodiment of the present invention is explained using FIG. 2E.

Again, as shown in FIG. 2E, the semiconductor device includes a substrate 200, a transistor 232 and a capacitor 234.

The substrate 200 has a transistor area 202 and a capacitor area 204. Furthermore, the capacitor area 104 has an isolation structure 208 therein.

The transistor 232 is disposed on the substrate 200 in the transistor area 204. The transistor 232 comprises a gate structure 225 on the substrate 200, a source/drain region 226 in the substrate 200 on each side of the gate structure 225, spacers 228 on the sidewalls of the gate structure 225 and a salicide layer 230a. The gate structure 225 further includes a gate dielectric layer 224 and a gate 222. The gate dielectric layer 224 is fabricated using silicon oxide and the gate 222 is fabricated using polysilicon or doped polysilicon, for example. In addition, the salicide layer 230a is disposed on the surface of the gate structure 225 and the source/drain regions 226. The salicide layer 230a is fabricated using a refractory metal salicide compound, for example. The refractory metal is selected from a group consisting of nickel, tungsten, cobalt, titanium, molybdenum and platinum.

The capacitor 234 is disposed on the isolation structure 208 within the capacitor area 204. The capacitor 234 comprises a first electrode 216, a dielectric layer 218, a second electrode 220 and a salicide layer 230b. The electrode 220 is disposed on the isolation structure 208 within the capacitor area 204. The electrode 220 is fabricated using, for example, polysilicon or doped polysilicon. The dielectric layer 218 is disposed on the electrode 220 and covers a portion of the surface of the electrode 220. The dielectric layer 218 serves as a capacitor dielectric layer and is a silicon oxide layer, for example. The electrode 216 is disposed on the dielectric layer 218. The electrode 216 is fabricated using, for example, polysilicon or doped polysilicon. The salicide layer 230b is disposed on the exposed electrode 220 and the exposed electrode 216. The salicide layer 230b is fabricated using, for example, a refractory metal salicide compound. The refractory metal is selected from a group consisting of nickel, tungsten, cobalt, titanium, molybdenum and platinum.

In summary, the present invention has at least the following advantages:

1. One masking process can be used to define the upper electrode of the PIP capacitor and the self-aligned silicide block layer simultaneously. Therefore, the fabrication process is simplified and the production cost is reduced.

2. The semiconductor devices have salicide layers disposed thereon to increase the accuracy of various capacitors and resistors and reduce the impedance of the metallic lines.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating semiconductor devices, comprising:
   providing a substrate having at least a transistor area, at least a capacitor area and at least a resistor area, wherein each of the capacitor area and the resistor area has an isolation structure therein;
   forming a gate structure on the substrate in the transistor area, forming a first electrode in the capacitor area, and forming a second electrode in the resistor area;
   forming first spacers on the sidewalls of the gate structure, the first electrode and the second electrode;
   forming a source/drain region in the substrate on the sides of the gate structure;
   sequentially and conformably forming a dielectric layer and a first conductive material layer over the substrate;
   performing a first patterning process to define the first conductive material layer and simultaneously forming a third electrode on the dielectric layer in the capacitor area and forming a conductive layer on the dielectric layer in the resistor area;
   forming second spacers on the sidewalls of the third electrode and the conductive layer;
   removing the dielectric layer uncovered by the third electrode, the conductive layer and the second spacers; and
   performing a self-aligned silicide process to form a salicide layer on the surface of the gate structure, the source/drain regions, the first electrodes, the third electrodes, the conductive layer and the second electrode.

2. The method of claim 1, wherein the first patterning process comprises performing a photolithographic process and an etching process.

3. The method of claim 1, wherein the method of forming the gate structure, the first electrode and the second electrode comprises:
   forming a dielectric material layer on the substrate in the transistor area;
   forming a second conductive material layer on the substrate to cover the dielectric material layer and the isolation structure;
   performing a second patterning process to define the second conductive material layer and simultaneously form a gate on the substrate in the transistor area, and form the first electrode in the capacitor area and the second electrode in the resistor area; and
   removing the dielectric material layer uncovered by the gate to form a gate dielectric layer, wherein the gate dielectric layer and the gate together constitute the gate structure.

4. The method of claim 3, wherein the material constituting the second conductive material layer comprises polysilicon or doped polysilicon.

5. The method of claim 3, wherein the second patterned process comprises performing a photolithographic process and an etching process.

6. The method of claim 1, wherein the material constituting the first conductive material layer comprises polysilicon or doped polysilicon.

7. The method of claim 1, wherein the material constituting the dielectric layer comprises silicon oxide or silicon nitride.

8. The method of claim 1, wherein the salicide layer comprises a refractory metal salicide compound.

9. The method of claim 8, wherein the refractory metal is selected from a group consisting of nickel, tungsten cobalt, titanium, molybdenum and platinum.

10. A method of fabricating semiconductor devices, comprising:
    providing a substrate having at least a transistor area and at least a capacitor area, wherein the capacitor area has an isolation structure therein;
    forming a first dielectric layer on the substrate in the transistor area;
    sequentially forming a first conductive layer, a second dielectric layer and a second conductive layer over the substrate to cover the isolation structure and the first dielectric layer;
    performing a first patterning process to define the second conductive layer and the second dielectric layer and form a first electrode and a capacitor dielectric layer of a capacitor in the capacitor area;
    performing a second patterning process to define the first conductive layer and form a second electrode of the capacitor in the capacitor area and a gate in the transistor area;
    removing the first dielectric layer uncovered by the gate to form a gate dielectric layer;
    forming a lightly doped drain (LDD) in the substrate on each side of the gate;
    forming first spacers on the sidewalls of the gate, the gate dielectric layer, the first electrode, the capacitor dielectric layer and the second electrode;
    forming a doped region in the substrate on each side of the first spacers in the transistor area, wherein the LDD and the doped region together form a source/drain region; and
    performing a self-aligned silicide process to form a salicide layer on the surface of the gate, the source/drain regions, the first electrode and the second electrode.

11. The method of claim 10, wherein the first patterning process comprises performing a photolithographic process and an etching process.

12. The method of claim 10, wherein the second patterning process comprises performing a photolithographic process and an etching process.

13. The method of claim 10, wherein the material constituting the first conductive material layer and the second conductive material layer comprises polysilicon or doped polysilicon.

14. The method of claim 10, wherein the material constituting the second dielectric layer comprises silicon oxide or silicon nitride.

15. The method of claim 10, wherein the salicide layer comprises a refractory metal salicide compound.

16. The method of claim 15, wherein the refractory metal is selected from a group consisting of nickel, tungsten, cobalt, titanium, molybdenum and platinum.

* * * * *